United States Patent [19]
Takemoto

[11] Patent Number: 5,675,602
[45] Date of Patent: Oct. 7, 1997

[54] OPTICAL INTEGRATED CIRCUIT DEVICE AND DRIVING METHOD THEREFOR

[75] Inventor: Akira Takemoto, Itami, Japan

[73] Assignee: Mitsubishi Denki Kabushiki Kaisha, Tokyo, Japan

[21] Appl. No.: 566,915

[22] Filed: Dec. 4, 1995

[30] Foreign Application Priority Data

Mar. 17, 1995 [JP] Japan ................................. 7-058733

[51] Int. Cl.$^6$ ........................................... H01S 3/10
[52] U.S. Cl. .......................... 372/50; 372/45; 372/46; 372/96
[58] Field of Search ................... 372/50, 45, 46, 372/96

[56] References Cited

U.S. PATENT DOCUMENTS

| | | | |
|---|---|---|---|
| 4,873,691 | 10/1989 | Uomi et al. | 372/20 |
| 5,325,392 | 6/1994 | Tohmori et al. | 372/96 |
| 5,388,106 | 2/1995 | Tabuchi | 372/50 |

FOREIGN PATENT DOCUMENTS

| | | |
|---|---|---|
| 0169567 | 1/1986 | European Pat. Off. |
| 0402907 | 12/1990 | European Pat. Off. |

OTHER PUBLICATIONS

Zah et al, "Integration Of A Multi-Wavelength Compressive-Strained Multi-Quantum-Well Distributed-Feedback Laser Array With A Star Coupler And Optical Amplifiers", 13th IEEE International Semiconductor Laser Conference, Sep. 1992, pp. 194–195.

Primary Examiner—James W. Davie
Attorney, Agent, or Firm—Leydig, Voit & Mayer, Ltd.

[57] ABSTRACT

An optical integrated circuit device includes a compound semiconductor substrate, a semiconductor laser including a compound semiconductor layer, a waveguide of a compound semiconductor layer having the same energy band gap as that of the semiconductor laser, a semiconductor amplifier having the same energy band gap as that of the semiconductor laser, a common electrode disposed on the rear surface of the substrate, a semiconductor laser electrode for current flow between the laser electrode and the common electrode so that the current is injected into the laser, a waveguide electrode for current flow between the waveguide electrode and the common electrode so that the current is injected into the waveguide, and a semiconductor amplifier electrode for current flow between the amplifier electrode and the common electrode so that the current is injected into the amplifier. Therefore, the compound semiconductor layers constituting the semiconductor laser, the waveguide, and the amplifier are grown as a single layer and the optical integrated circuit device is easily fabricated, and an absorption loss in the waveguide is suppressed by applying a voltage across the common electrode and the waveguide electrode to inject current into the waveguide.

14 Claims, 7 Drawing Sheets

OPTICAL INTEGRATED CIRCUIT DEVICE AND DRIVING METHOD THEREFOR

FIELD OF THE INVENTION

The present invention relates to an optical integrated circuit device employed for an optical communication system and a driving method therefor.

BACKGROUND OF THE INVENTION

FIGS. 11(a)–11(c) show a prior art optical integrated circuit device, for example, cited in "13th IEEE INTERNATIONAL SEMICONDUCTOR LASER CONFERENCE" Conference Digest pp.194–195. FIG. 11(a) is a top view illustrating the optical integrated circuit device, FIG. 11(b) is a sectional view taken along a line 11b—11b of FIG. 11(a), and FIG. 11(c) is a graph showing energy band gaps at respective positions of a semiconductor laser, a wave synthesizer, and a semiconductor amplifier in the left to right direction in FIG. 11(b). In order to easily understand the structure, current blocking layers and layers positioned above semiconductor layers comprising the semiconductor laser and the like, are omitted in FIG. 11(a). In the figures, reference numeral 1 designates a compound semiconductor substrate comprising a cladding layer of a first conductivity type for light confinement. Reference numeral 2 designates semiconductor lasers comprising a compound semiconductor layer and formed on the compound semiconductor substrate 1, numeral 3 designates a wave synthesizer comprising a waveguide layer and formed on the compound semiconductor substrate 1 so as to synthesize laser beams emitted from three semiconductor lasers 2, and numeral 4 designates a semiconductor amplifier comprising the compound semiconductor layer and formed on the compound semiconductor substrate 1 so as to amplify a laser beam emitted from the wave synthesizer 3. Reference numeral 5 designates a cladding layer of a second conductivity type formed on the semiconductor lasers 2, the wave synthesizer 3, and the semiconductor amplifier 4. Reference numeral 6 designates a semiconductor laser electrode formed on the cladding layer 5 opposite the semiconductor lasers 2. Reference numeral 7 designates a semiconductor amplifier electrode formed on the cladding layer 5 opposite the semiconductor amplifier 4. Reference numeral 8 designates a common electrode formed on the rear surface of the compound semiconductor substrate 1.

In addition, respective active layers constituting the semiconductor lasers 2 and the semiconductor amplifier 4 comprise semiconductor materials having the same energy band gap $E_{LD}$ and the waveguide layer constituting the wave synthesizer 3 comprises a semiconductor material having an energy band gap $E_{WG}$ different from the energy band gap of the active layers.

Next, a description is given of an operation of a prior art optical integrated circuit device. Initially, when a current flows between the common electrode 8 and the semiconductor laser electrode 6, electrons and holes are injected into the semiconductor lasers 2, whereby a light beam having a wavelength corresponding to an energy band gap $E_{LD}$ of the active layer constituting the semiconductor lasers 2 is generated by recombination of electrons and holes. This generated light is amplified as it advances in the semiconductor lasers 2 and amplified and reflected by an optical resonator not shown here, and laser oscillation occurs if the current is higher than a predetermined value. The laser beams that are respectively emitted from three semiconductor lasers 2 are advanced rightward in the figure and synthesized at the wave synthesizer 3 and, thereafter they are incident on the semiconductor amplifier 4. As the wave synthesizer 3, an example of a waveguide transmitting, synthesizing, and dividing light beams is illustrated, and other examples may be employed. Since the semiconductor amplifier 4 has the same structure as that of the semiconductor lasers 2, when a current flows between the common electrode 8 and the semiconductor amplifier electrode 7, electrons and holes are injected into the active layer constituting the semiconductor amplifier 4, whereby a light beam having a wavelength corresponding to an energy band gap of the active layer is emitted by recombination of electrons and holes, as in the semiconductor lasers 2. In a case where the current is lower than the predetermined value, laser oscillation does not occur and only amplification is performed. Since the energy band gap of the semiconductor amplifier 4 is the same as the energy band gap $E_{LD}$ of the semiconductor lasers 2, a light beam having a wavelength corresponding to that of an incident light beam is emitted from the semiconductor amplifier 4, and the incident laser beam is amplified at the semiconductor amplifier 4. The incident laser beam is amplified from several times to several tens of times and emitted from a right end of the semiconductor amplifier 4. Then, the emitted laser beam is incident on an optical fiber through a lens and employed as a light source for optical communication.

In the optical integrated circuit device, there is the following problem generally, i.e., it is necessary, as shown in FIG. 11(c), that the wave synthesizer 3 comprising the semiconductor having the different energy band gap from the energy band gaps of the semiconductor laser 2 and the semiconductor amplifier 4 be formed between the laser 2 and the amplifier 4 each comprising the semiconductor having the same energy band gap.

That is, when the energy band gap of the semiconductor constituting the semiconductor lasers 2 is $E_{LD}$, a wavelength λ of the laser beam is represented by $$\lambda = hC/E_{LD}$$

where h is Planck's constant and C is light velocity. Generally, since the light beam having such a wavelength is largely absorbed in the semiconductor having the energy band gap $E_{LD}$ and decreased, the energy band gap $E_{WG}$ of the semiconductor constituting the wave synthesizer 3 is larger than the energy band gap $E_{LD}$ of the semiconductor constituting the semiconductor lasers 2 so that the light beam is not absorbed. The difference in the energy band gaps is generally required to be $\Delta E = E_{WG} - E_{LD} = 50$ meV.

In order to form a semiconductor region having the different energy band gaps on the compound semiconductor substrate 1, two processes, etching and selective growth, are employed. In the etching method, in a case where semiconductor regions each having different energy band gaps $E_1$ and $E_2$ are formed on the compound semiconductor substrate 1, initially a semiconductor layer having the energy band gap $E_1$ is formed and, thereafter, a portion where a semiconductor region having the energy band gap $E_2$ is to be formed is etched, and the semiconductor layer having the energy band gap $E_2$ is formed at the etched part. In the selective growth method, when a dielectric mask such as $SiO_2$ is formed on a part of the compound semiconductor substrate 1 and a mixed crystal semiconductor layer is grown employing the dielectric mask, the energy band gap of the semiconductor formed near the mask is changed in accordance with the width of the masked part. For example, when a semiconductor layer is formed on the compound semiconductor substrate 1 without providing the mask on a first region while providing the mask on a second region adjacent to the first region, a semiconductor layer having different energy band gaps $E_1$ and $E_2$ in the first region and the second region, respectively, is formed.

However, in the above-described etching method, though the semiconductor layers having different energy band gaps are discontinuous, and processing precision of 0.01 µm is required in order to advance the light beam through the discontinuous connected part without any losses, a semiconductor layer having a high precision is not obtained.

Further, in the above-described selective growth method, in a method of fabricating an optical integrated circuit device with a practical use, since it is difficult to sharply change the energy band gap, and a difference in level caused by a difference of the growth rate is produced between a first region where the dielectric mask is absent and a second region where the dielectric mask is present, it is difficult to perform fine processing later.

SUMMARY OF THE INVENTION

It is an object of the present invention to provide an optical integrated circuit device which is easily fabricated with a high performance, and a driving method therefor.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, an optical integrated circuit device comprises a compound semiconductor substrate, a semiconductor laser comprising a compound semiconductor layer and disposed on the front surface of the compound semiconductor substrate, a non-linear waveguide comprising a compound semiconductor layer having the same energy band gap as the energy band gap of the semiconductor laser, and disposed on the front surface of the compound semiconductor substrate and optically connected to the semiconductor laser, a common electrode disposed on the rear surface of the compound semiconductor substrate, a semiconductor laser electrode for flowing current between the laser electrode and the common electrode so that the current is injected into the laser, and a waveguide electrode for flowing current between the waveguide electrode and the common electrode so that the current is injected into the waveguide. Since the energy band gaps of the compound semiconductor layers constituting the semiconductor laser and the waveguide are the same with each other, both compound semiconductor layers are grown as a single layer and the optical integrated circuit device is easily fabricated. Further, since the waveguide electrode is provided, an absorption loss in the waveguide is decreased by applying a voltage across the common electrode and the waveguide electrode to inject current into the waveguide.

According to a second aspect of the present invention, an optical integrated circuit device comprises a compound semiconductor substrate, a plurality of semiconductor lasers each comprising a compound semiconductor layer and disposed on the front surface of the compound semiconductor substrate, a wave synthesizer comprising a compound semiconductor layer having the same energy band gap as the energy band gap of the semiconductor laser, and disposed on the front surface of the substrate and respectively optically connected to a plurality of semiconductor lasers to synthesize the laser beams emitted from the semiconductor lasers, a semiconductor amplifier comprising a compound semiconductor layer having the same energy band gap as the energy band gap of the semiconductor laser, and disposed on the front surface of the substrate and optically connected to the wave synthesizer, a common electrode disposed on the rear surface of the compound semiconductor substrate, a semiconductor laser electrode for flowing current between the laser electrode and the common electrode so that the current is injected into the laser, a wave synthesizer electrode for flowing current between the wave synthesizer electrode and the common electrode so that the current is injected into the wave synthesizer, and a semiconductor amplifier electrode for flowing current between the amplifier electrode and the common electrode so that the current is injected into the amplifier. Since the energy band gaps of the compound semiconductor layers each constituting the semiconductor laser, the wave synthesizer, and the semiconductor amplifier are the same with each other, the above-described all compound semiconductor layers are grown as a single layer and the optical integrated circuit device is easily fabricated. Further, since the wave synthesizer electrode is provided, an absorption loss in the wave synthesizer is decreased by applying a voltage across the common electrode and the wave synthesizer electrode to inject current into the wave synthesizer.

According to a third aspect of the present invention, in the optical integrated circuit device, a diffraction grating is disposed adjacent to the semiconductor laser, whereby a high-performance optical integrated circuit device using a distributed feedback (DFB) semiconductor laser is obtained with a low cost.

According to a fourth aspect of the present invention, in the optical integrated circuit device, the semiconductor laser comprises a multi-quantum well structure, thereby reducing the state density and improving the laser characteristics.

According to a fifth aspect of the present invention, in the optical integrated circuit device, one semiconductor laser is provided, and the waveguide comprises a wave divider for dividing laser beams emitted from one semiconductor laser. Therefore, the laser beam can be synthesized while suppressing an absorption loss of the laser beam.

According to a sixth aspect of the present invention, in the optical integrated circuit device, a plurality of semiconductor lasers are provided, and the waveguide comprises a wave synthesizer for synthesizing laser beams emitted from a plurality of semiconductor lasers. Therefore, the laser beam can be divided while suppressing an absorption loss of the laser beam.

According to a seventh aspect of the present invention, in the optical integrated circuit device, a plurality of semiconductor lasers are provided, and the waveguide comprises a wave synthesizer-divider for synthesizing laser beams emitted from a plurality of semiconductor lasers and then dividing them. Therefore, the laser beam can be synthesized and divided while suppressing an absorption loss of the laser beam.

According to an eighth aspect of the present invention, the optical integrated circuit device further includes a photodiode disposed on the compound semiconductor substrate, and the waveguide arranged so that first and second waveguide parts of the waveguide constitute a Mach-Zehnder interferometer, where first waveguide part is optically connected to the photodiode and second waveguide part is optically connected to the semiconductor laser.

Therefore, an absorption loss in the waveguide is suppressed as well as the laser beam emitted from the semiconductor laser is controlled.

According to a ninth aspect of the present invention, in the optical integrated circuit device, the waveguide functions as a lens for converging laser beam produced in the semiconductor laser and emitting the laser beam to the outside of the device. Therefore, an absorption loss in the waveguide is suppressed as well as the laser beam is incident on an optical fiber without passing through a lens.

According to a tenth aspect of the present invention, the optical integrated circuit device further includes a groove provided between the semiconductor laser and the waveguide. Therefore, a high-performance optical integrated circuit device using Fabry-Perot (FP) semiconductor laser, where the side surface of the groove and the facet of the semiconductor laser are reflecting mirror surfaces, is obtained with a low cost.

According to an eleventh aspect of the present invention, in a method of driving an optical integrated circuit device, a voltage is applied across the common electrode and the waveguide electrode to inject current into the waveguide, thereby reducing an absorption loss in the waveguide.

According to a twelfth aspect of the present invention, in a method of driving an optical integrated circuit device, a voltage is applied across the common electrode and the wave synthesizer electrode to inject current into the wave synthesizer, thereby reducing an absorption loss in the wave synthesizer.

DETAILED DESCRIPTION OF THE PREFERRED EMBODIMENTS

Embodiment 1

Figure 1:
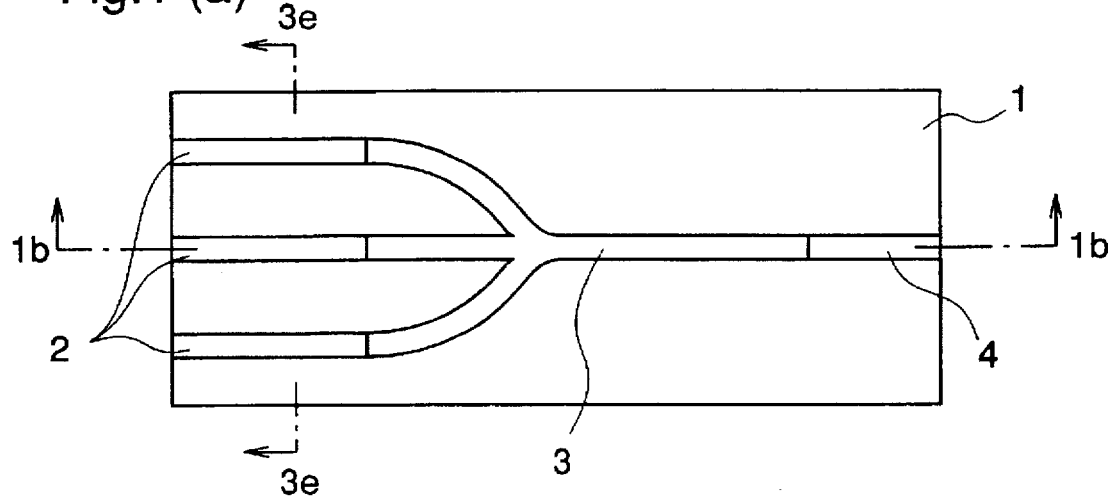
FIG. 1(a) is a top view and FIG. 1(b) is a sectional view, illustrating an optical integrated circuit device according to a first embodiment of the present invention.
FIG. 1(c) is a graph showing energy band gap.
Figure 1:
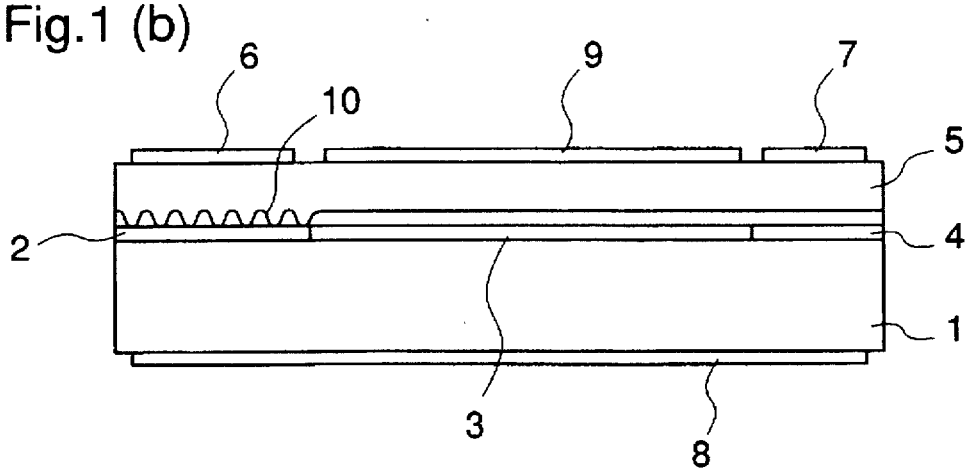
Figure 1:
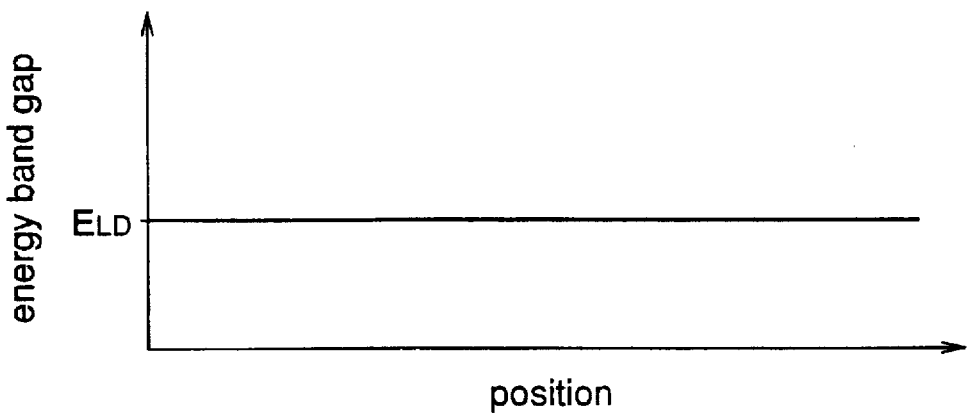

FIGS. 1(a)–1(c) are diagrams illustrating an optical integrated circuit device according to a first embodiment of the present invention, in which FIG. 1(a) is a top view, FIG. 1(b) is a sectional view taken along a line 1b—1b of FIG. 1(a), and FIG. 1(c) is a graph showing the energy band gap at respective positions of a semiconductor laser, a wave synthesizer, and a semiconductor amplifier in the left to right direction in FIG. 1(b). In order to easily understand the structure, current blocking layers and layers positioned above semiconductor layers constituting semiconductor lasers and the like are omitted in FIG. 1(a). In the figures, reference numeral 1 designates an n type compound semiconductor substrate constituting a cladding layer for light confinement and having an energy band gap $E_{SUB}$. Three semiconductor lasers 2, formed at the left end part on the compound semiconductor substrate 1 and parallel to each other, comprise a compound semiconductor layer and perform laser oscillation. The semiconductor lasers 2 comprise a semiconductor layer having a smaller energy band gap $E_{LD}$ than the energy band gap $E_{SUB}$. A wave synthesizer 3 comprises a compound semiconductor layer formed on the compound semiconductor substrate 1 continuous with the semiconductor lasers 2 to synthesize laser beams that are emitted from the three semiconductor lasers 2. The compound semiconductor layer has the same energy band gap $E_{WG}$ as the energy band gap $E_{LD}$ of the semiconductor lasers 2. A semiconductor amplifier 4 comprises a compound semiconductor layer formed at right end of the compound semiconductor substrate 1 continuous with the wave synthesizer 3 to amplify a laser beam that is emitted from the wave synthesizer 3. The compound semiconductor layer has the same energy band gap $E_{AMP}$ as the energy band gap $E_{LD}$ of the semiconductor lasers 2. A cladding layer 5 comprises a p type semiconductor layer that is formed above the semiconductor lasers 2, the wave synthesizer 3, and the semiconductor amplifier 4, which layer has the same energy band gap as the compound semiconductor substrate 1. Reference numeral 6 designates a semiconductor laser electrode formed on the cladding layer 5 opposite the semiconductor lasers 2, numeral 9 designates a wave synthesizer electrode formed on the cladding layer 5 opposite the wave synthesizer 3, numeral 7 designates a semiconductor amplifier electrode formed on the cladding layer 5 opposite the semiconductor amplifier 4, and numeral 8 designates a common electrode disposed on the rear surface of the compound semiconductor substrate 1. Reference numeral 10 designates a diffraction grating formed adjacent to the semiconductor lasers 2 between the semiconductor lasers 2 and the cladding layer 5 and having periodic projections and grooves. Reference numeral 30 designates a diffraction grating formation layer formed on the wave synthesizer 3 and the semiconductor amplifier 4 between these layers and the cladding layer 5.

Figure 2:
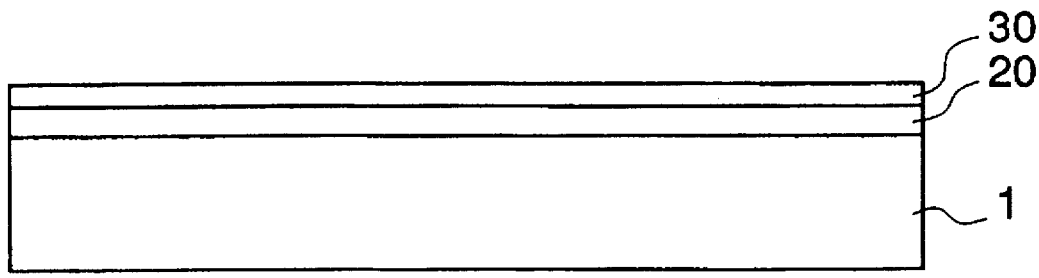
FIGS. 2(a)–2(c) are sectional views illustrating process steps in a method of fabricating the optical integrated circuit device according to the first embodiment of the present invention.
Figure 2:
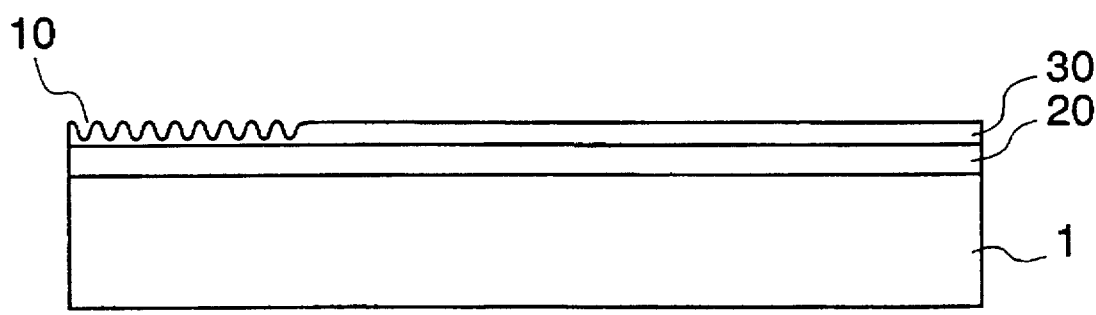
Figure 2:
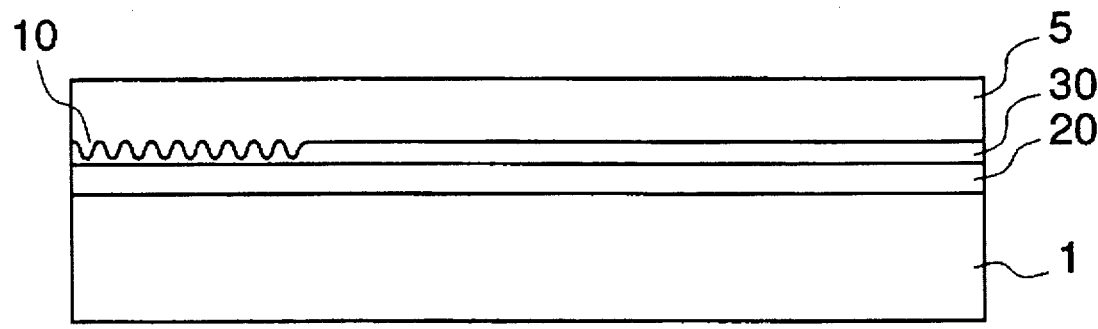
Figure 3:
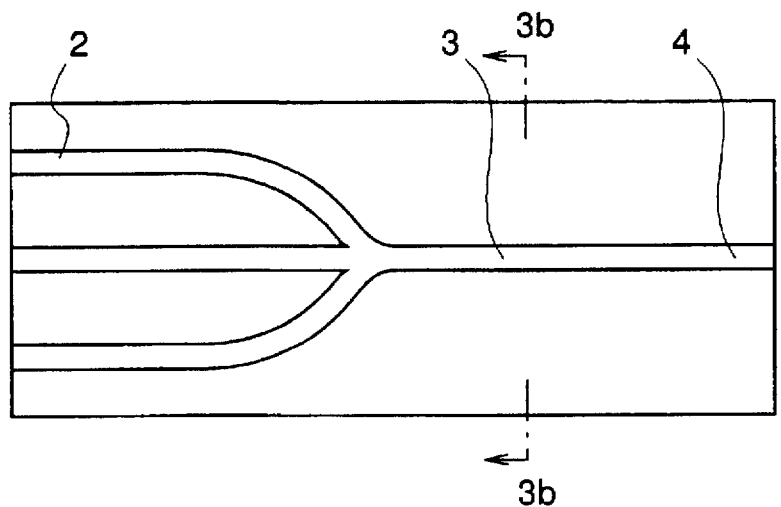
FIG. 3(a) is a top view and FIGS. 3(b)–3(e) are sectional views, illustrating process steps in a method of fabricating the optical integrated circuit device according to the first embodiment of the present invention.
Figure 3:
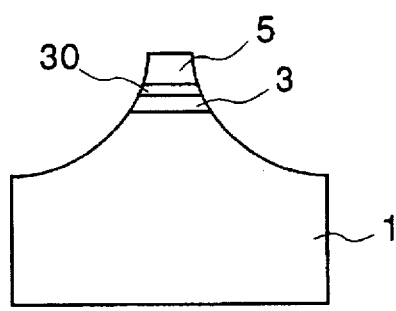
Figure 3:
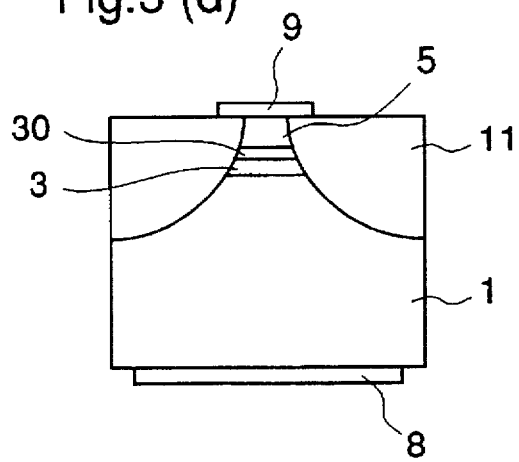
Figure 3:
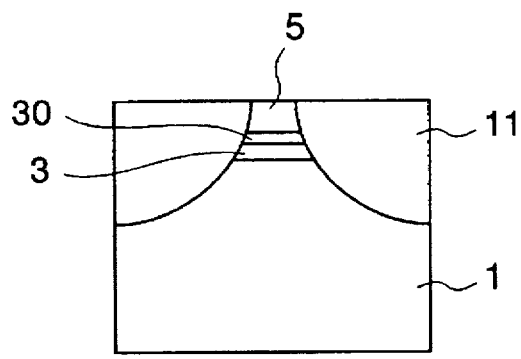
Figure 3:
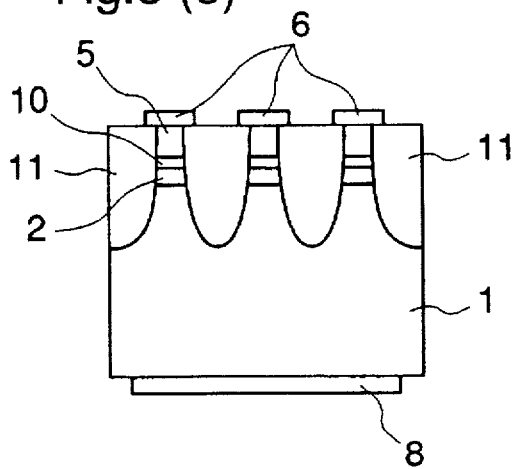

FIGS. 2(a)–2(c) and 3(a)–3(e) are diagrams illustrating process steps in a method of fabricating an optical integrated circuit device according to the first embodiment of the present invention, in which FIGS. 2(a)–2(c) are sectional views illustrating process steps in a growth of a semiconductor layer, FIG. 3(a) is a process view illustrating a patterning of the device, FIGS. 3(b)–3(d) are sectional process views taken along a line 3b—3b in FIG. 3(a), and FIG. 3(e) is a sectional view taken along a line 3e—3e in FIG. 1(a). In these figures, the same reference numerals as in FIGS. 1(a) and 1(b) designate the same or corresponding parts. Reference numeral 11 designates a current blocking layer and numeral 20 designates a semiconductor layer serving as the semiconductor laser, the wave synthesizer, and the semiconductor amplifier layer.

Next, a description is given of a method of fabricating an optical integrated circuit device according to the first embodiment of the invention with reference to FIGS. 2(a)–2(c) and 3(a)–3(e). In the first embodiment, disclosed is a case where the present invention is applied to an InP series optical integrated circuit device. Initially, in the step of FIG. 2(a), a semiconductor layer 20 and a diffraction grating formation layer 30 are successively formed on an n type InP substrate 1 by metal organic chemical vapor deposition (hereinafter, referred to as MOCVD), and a multi-quantum-well structural layer is employed for the semiconductor layer 20 in order to reduce state density and improve laser characteristics. This multi-quantum-well structural layer comprises an n type $In_{0.82}Ga_{0.18}As_{0.39}P_{0.61}$ layer 300 Å thick, a layer including alternatingly laminated seven undoped $In_{0.47}Ga_{0.53}As$ layers 80 Å thick and six undoped $In_{0.82}Ga_{0.18}As_{0.39}P_{0.61}$ layers 80 Å thick, a p type $In_{0.82}Ga_{0.18}As_{0.39}P_{0.61}$ layer. In addition, the diffraction grating formation layer 30 comprises a p type $In_{0.78}Ga_{0.22}As_{0.47}P_{0.53}$ layer 200 Å thick.

In the step of FIG. 2(b), the diffraction grating 10 having a period of about 2400 Å is formed at a portion of the diffraction grating formation layer 30 corresponding to regions of the semiconductor layer 20 where semiconductor lasers are later fabricated.

In the step of FIG. 2(c), employing MOCVD again, a p type InP cladding layer 5 is formed on the diffraction grating 10 and the diffraction grating formation layer 30.

In the steps of FIGS. 3(a) and 3(b), the structure is patterned by photolithography and etched in a mesa shape employing bromomethanol, thereby forming the semiconductor lasers 2, the wave synthesizer 3, and the semiconductor amplifier 4.

In the step of FIG. 3(c), employing MOCVD again, Fe doped InP current blocking layers 11 are formed on the substrate 1 so as to bury the mesa-shaped structure.

In the steps of FIGS. 3(d) and 3(e), the common electrode 8 is formed on the rear surface of the semiconductor substrate 1, the semiconductor laser electrode 6 is formed on the cladding layer 5 opposite the semiconductor lasers 2, the wave synthesizer electrode 9 is formed on the cladding layer 5 opposite the wave synthesizer 3, and the semiconductor amplifier electrode 7 is formed on the cladding layer 5 opposite the semiconductor amplifier 4, respectively, thereby completing an optical integrated circuit device. Although a buffer layer is usually disposed on the substrate 1 for improving crystallinity, it is omitted for simplification of the figure in the above-described explanation.

Figure 4:
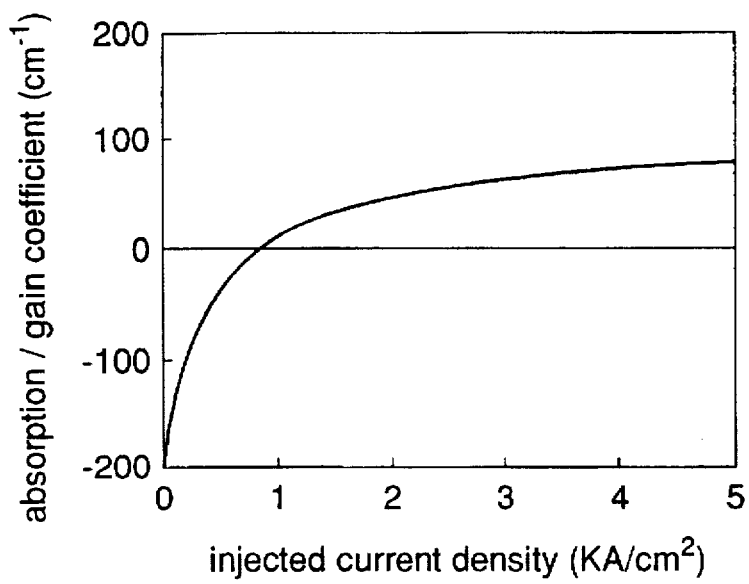
FIG. 4 is a graph showing a relation between absorption/gain coefficient and injected current density in a case where a multi-quantum-well structural layer is employed in the semiconductor layer of the optical integrated circuit device according to the first embodiment of the present invention.

FIG. 4 is a graph showing a relation between absorption/gain coefficient and injected current density in a case where a multi-quantum-well structural layer is employed in the semiconductor laser, the waveguide, and the semiconductor amplifier, in which plus indicates gain and minus indicates absorption, respectively. As shown in FIG. 4, when no current is injected, the absorption coefficient is as large as $-200$ cm$^{-1}$, on the other hand, when a current density of 800 A/cm$^2$ flows, the absorption coefficient is nearly 0, whereby the absorption is suppressed to a degree that is not a problem in practical use. In addition, when a current density above 800 A/cm$^2$ flows, the absorption coefficient becomes positive and a waveguide producing gain is obtained. The semiconductor laser and the semiconductor amplifier are operated at a region where gain is produced.

Next, a description is given of operation. When a current flows between the semiconductor laser electrode 6 and the common electrode 8, electrons and holes are injected into the semiconductor lasers 2, whereby light beams having a wavelength corresponding to an energy band gap $E_{LD}$ of the semiconductor layer constituting the semiconductor lasers 2 are generated by recombination of electrons and holes. The generated light beams are amplified upon advancing in the semiconductor lasers 2, and only light beams having a prescribed wavelength corresponding to the period of the diffraction grating 10 among the light beams are repeatedly amplified and reflected in the semiconductor lasers 2. In addition, when a sufficiently high current flows, laser oscillation finally occurs. Generally, laser oscillation occurs with a current density of 1 kA/cm$^2$. If a period of the diffraction grating 10 formed adjacent to each semiconductor laser 2 is slightly changed, laser beams each having a different wavelength are respectively emitted from the semiconductor lasers 2. The laser beams each having a plurality of wavelengths generated in the semiconductor lasers 2 advance in the wave synthesizer 3. In the wave synthesizer 3, as described in FIG. 4, in a case where no current flows between the wave synthesizer electrode 9 and the common electrode 8, the energy band gap $E_{LD}$ of the semiconductor lasers 2 is the same as the energy band gap $E_{WG}$ of the wave synthesizer 3. The laser beam which is incident on the wave synthesizer 3 suffers an absorption loss of 1000 dB/cm, so that the optical integrated circuit device is of no practical use. On the contrary, in a case where a current density of 800 A/cm$^2$ flows between the wave synthesizer electrode 9 and the common electrode 8, the optical integrated circuit device is of practical use because absorption between the energy band gaps hardly occurs and the absorption loss of the laser beam which is incident on the wave synthesizer 3 is suppressed to 5 dB/cm. The above-described laser beams are synthesized in the wave synthesizer 3 where the absorption loss is suppressed, advanced in one waveguide, and incident on the semiconductor amplifier 4. The semiconductor amplifier 4 has the amplification function as described for the prior art by current flow between the common electrode 8 and the semiconductor amplifier electrode 7. Therefore, the laser beam which is incident on the semiconductor amplifier 4 is amplified there and then emitted from right end of the semiconductor amplifier 4.

According to the first embodiment, since the absorption loss in the wave synthesizer 3 is suppressed due to current injection into the wave synthesizer 3, it is possible that the energy band gaps of the semiconductor layers constituting the semiconductor lasers 2, the wave synthesizer 3, and the semiconductor amplifier 4 are the same as each other, and the semiconductor layers are grown as a single layer without employing etching and selective growth as in the prior art technique. Therefore, the optical integrated circuit device is easily fabricated with a low cost and a high performance optical integrated circuit device is obtained because the semiconductor layers are continuous over the semiconductor lasers 2 and the wave synthesizer 3, and over the wave synthesizer 3 and the semiconductor amplifier 4, respectively.

Embodiment 2

Figure 5:
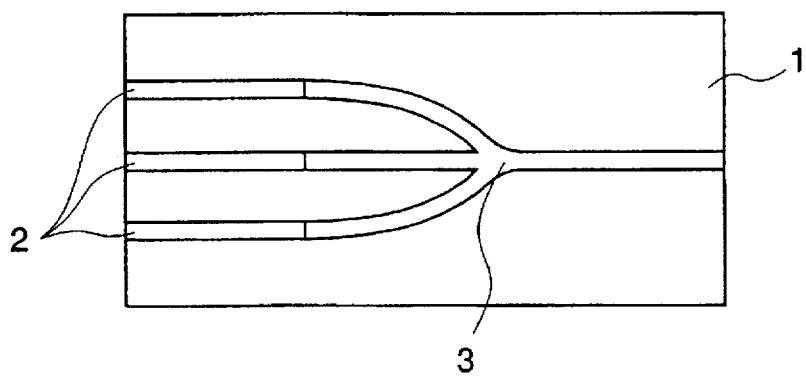
FIG. 5 is a top view illustrating an optical integrated circuit device according to a second embodiment of the present invention.

FIG. 5 is a top view illustrating an optical integrated circuit device according to a second embodiment of the present invention. In FIG. 5, the same reference numerals as in FIGS. 1(a) and 1(b) designate the same or corresponding parts. While the optical integrated circuit device shown in FIGS. 1(a)–1(c) comprises the semiconductor lasers 2, the wave synthesizer, i.e., the waveguide 3, and the semiconductor amplifier 4, the optical integrated circuit device shown in FIG. 5 comprises the semiconductor lasers 2 and the waveguide 3, except for the semiconductor amplifier 4, different from the device shown in FIGS. 1(a)–1(c). Therefore, the optical integrated circuit device of the second embodiment is fabricated as in the first embodiment. Further, the operation is the same as in FIGS. 1(a)–1(c) except that amplification by the semiconductor amplifier is not performed. According to the optical integrated circuit device of the second embodiment, since the absorption loss of the laser beam emitted from the semiconductor lasers 2 in the waveguide 3 is suppressed by injecting a current into the waveguide 3 from the waveguide electrode not shown here, it is possible that the energy band gaps of the semiconductor layers constituting the waveguide 3 and the semiconductor lasers 2 are the same as each other and the semiconductor layers are grown as a single layer, thereby easily fabricating a high performance optical integrated circuit device with a low cost.

Embodiment 3

Figure 6:
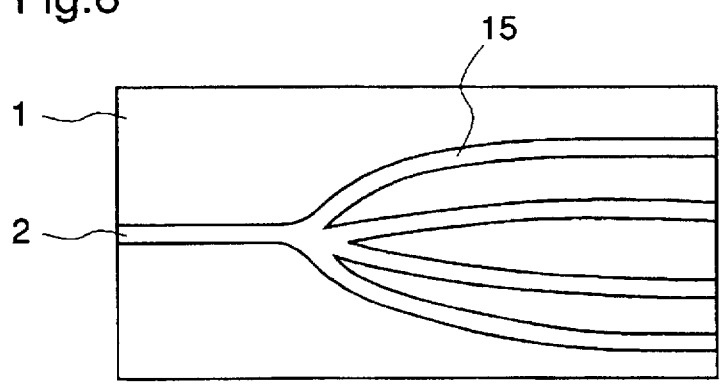
FIG. 6 is a top view illustrating an optical integrated circuit device according to a third embodiment of the present invention.
Figure 7:
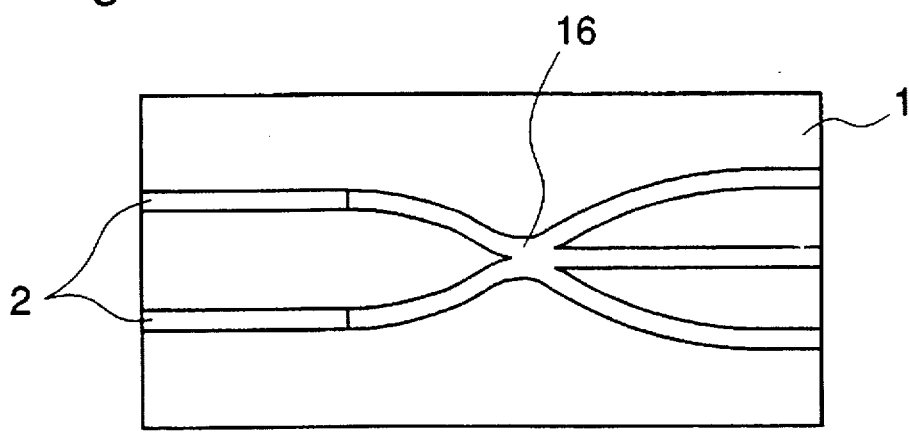
FIG. 7 is a top view illustrating an optical integrated circuit device according to the third embodiment of the present invention.

FIGS. 6 and 7 are top views illustrating an optical integrated circuit device according to a third embodiment of the present invention. In FIGS. 6 and 7, the same reference numerals as in FIGS. 1(a) and 1(b) designate the same or corresponding parts. Reference numeral 15 designates a wave divider and numeral 16 designates a wave synthesizer-divider. In the third embodiment, the waveguide 3 of the optical integrated circuit device shown in FIG. 5 is constituted by the wave divider or the wave synthesizer-divider. As the optical integrated circuit device shown in FIG. 5, there are three semiconductor lasers 2 and one wave synthesizer 3, on the other hand, as the optical integrated circuit device shown in FIG. 6, there is one semiconductor laser 2 and the wave divider 15 optically connected to the semiconductor laser 2. In the optical integrated circuit device shown in FIG. 6, the absorption loss in the wave divider 15 is suppressed by injecting a current into the wave divider 15, and the semiconductor layers constituting the semiconductor laser 2 and the wave divider 15 are grown as a single layer, thereby easily fabricating a high performance optical integrated circuit device with a low cost.

Further, as the optical integrated circuit device shown in FIG. 7, there are two semiconductor lasers 2 and a wave synthesizer-divider 16 optically connected to the semiconductor lasers 2. In the optical integrated circuit device shown in FIG. 7, the absorption loss in the wave synthesizer-divider 16 is suppressed by injecting a current into the wave synthesizer-divider 16, and the semiconductor layers constituting the semiconductor lasers 2 and the wave synthesizer-divider 16 are grown as a single layer, thereby easily fabricating a high performance optical integrated circuit device with a low cost.

Embodiment 4

Figure 8:
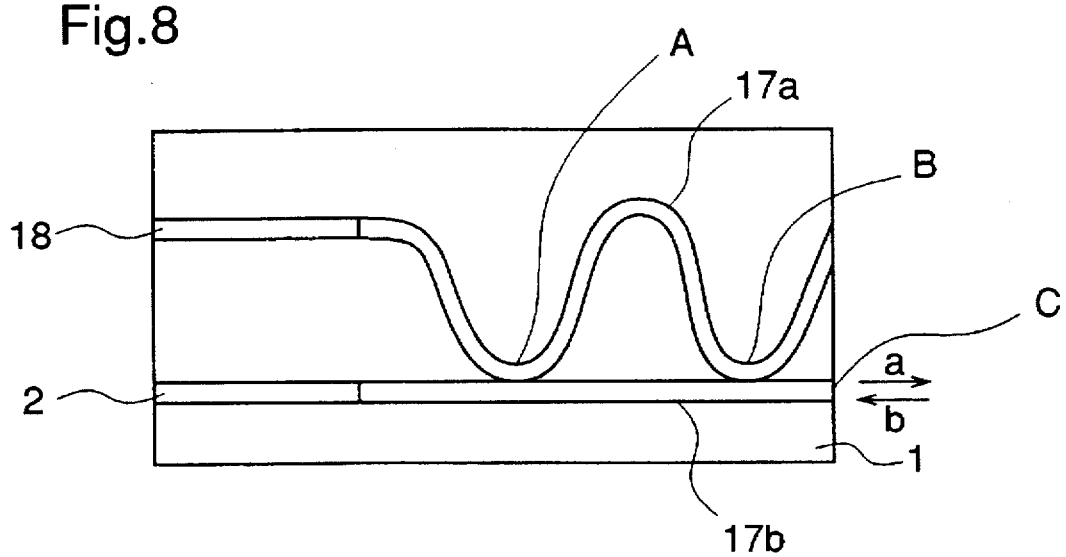
FIG. 8 is a top view illustrating an optical integrated circuit device according to a fourth embodiment of the present invention.

FIG. 8 is a top view illustrating an optical integrated circuit device according to a fourth embodiment of the present invention. In FIG. 8, the same reference numerals as in FIG. 5 designate the same or corresponding parts. Reference numerals 17a and 17b designate waveguide parts constituting a Mach-Zehnder interferometer, numeral 18 designates a photodiode, and reference characters A and B indicate light coupling parts, character C indicates an input-output part, character a indicates an emitted light beam, and character b indicates an incident light beam. As the optical integrated circuit device of the fourth embodiment, the semiconductor laser 2 and the photodiode 18 are disposed on the compound semiconductor substrate 1 parallel to each other. As for the waveguides, a linear waveguide part 17b and a wave shaped waveguide part 17a are optically connected at two curvatures A and B, thereby constituting the Mach-Zehnder interferometer. Then, one end of the linear waveguide part 17b is optically connected to the semiconductor laser 2 and one end of the wave shaped waveguide part 17a is optically connected to the photodiode 18, respectively.

When a laser beam having a wavelength of λ1 is emitted from the semiconductor laser 2, the laser beam is transmitted rightward of the figure, divided into two halves at A point, and guided. Then, the laser beam is synthesized at B point. If a length of the waveguide is adjusted in order to make the difference ΔL between the two optical paths equal to an integer multiple of the wavelength λ1, the laser beam is transmitted to an input-output part C, whereby the laser beam a is emitted to the outside from the input-output part C.

On the other hand, when a laser beam b having a wavelength λ2 is transmitted from the input-output part C, the incident light beam is divided into two halves at B point and synthesized at A point, conversely with the above-described emitted light beam. When the difference ΔL of two optical paths is increased to a value one-half an integer multiple of the wavelength λ2, the incident light beam is transmitted to a photodiode 18, which photodiode 18 detects an intensity of this incident light beam. Therefore, the laser beam that is emitted from the semiconductor laser 2 can be controlled by feedback controlling the laser beam employing a detecting signal of the photodiode 18. Then, the absorption loss in the waveguide parts 17a and 17b is suppressed as described above and a high performance optical integrated circuit device can be easily fabricated with a low cost.

Embodiment 5

Figure 9:
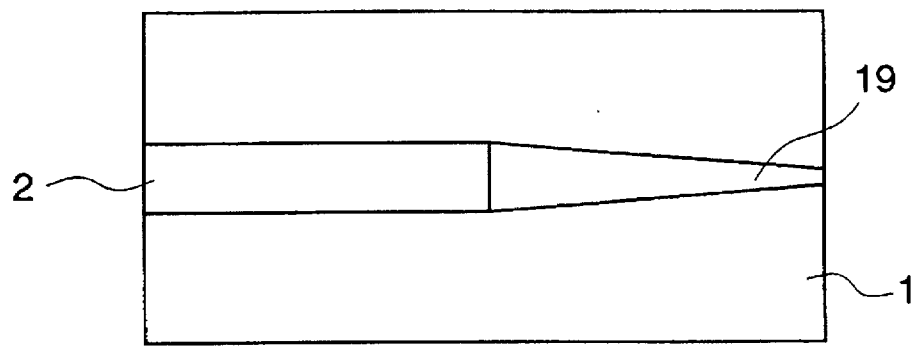
FIG. 9 is a top view illustrating an optical integrated circuit device according to a fifth embodiment of the present invention.

FIG. 9 is a top view illustrating an optical integrated circuit device according to a fifth embodiment of the present invention. In FIG. 9, the same reference numerals as in FIG. 5 designate the same or corresponding parts. Reference numeral 19 designates a waveguide. In the optical integrated circuit device of the fifth embodiment, the width of the waveguide 19 which is optically connected to the semiconductor laser 2 is linearly reduced in a direction of advance of the laser beam emitted from the semiconductor laser 2 as shown in FIG. 9. As for the optical integrated circuit device, a high performance optical integrated circuit device can be easily fabricated with a low cost as described above, and an absorption loss in the waveguide 19 is suppressed, and the waveguide 19 functions as a lens which converges the laser beam emitted from the semiconductor laser 2, whereby the laser beam is directly incident on the optical fiber without passing through the lens.

Embodiment 6

Figure 10:
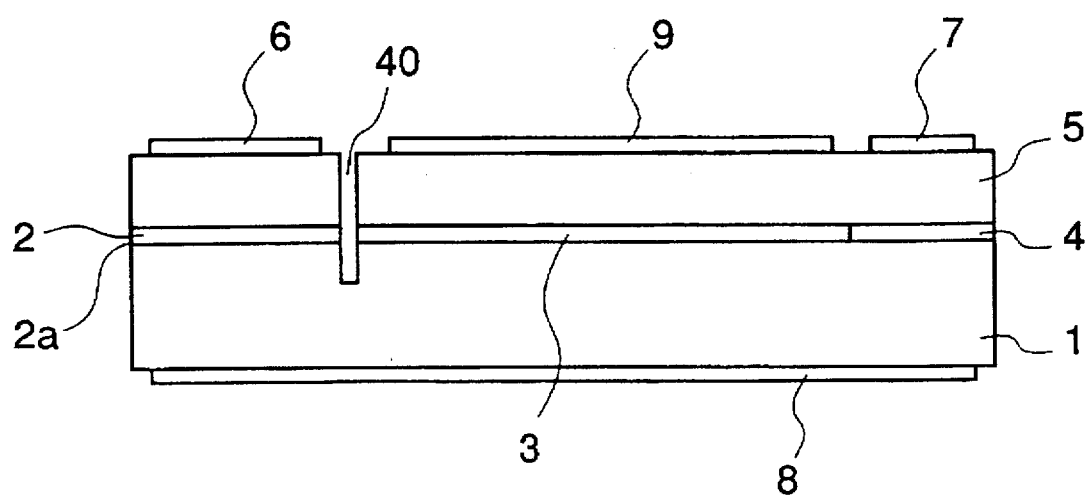
FIG. 10 is a sectional view illustrating an optical integrated circuit device according to a sixth embodiment of the present invention.
Figure 11:
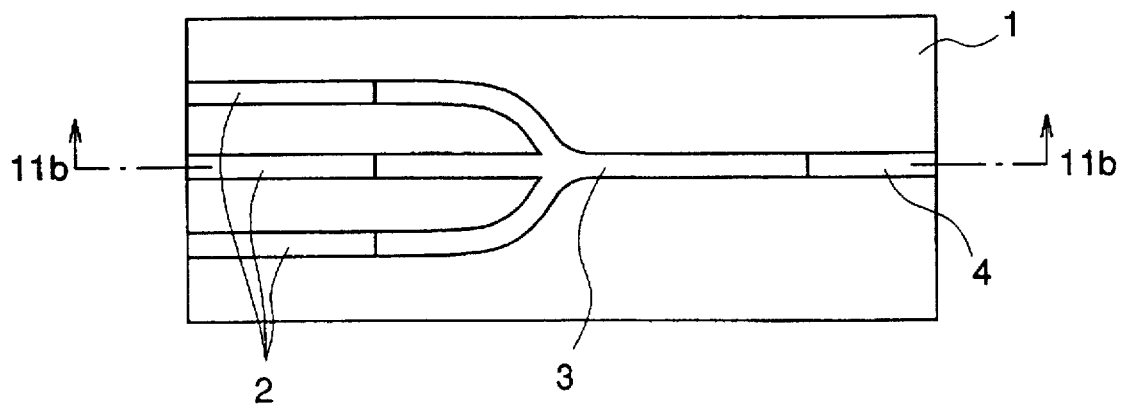
FIG. 11(a) is a top view and FIG. 11(b) is a sectional view, illustrating a prior art optical integrated circuit device.
FIG. 11(c) is a graph showing energy band gap.
Figure 11:
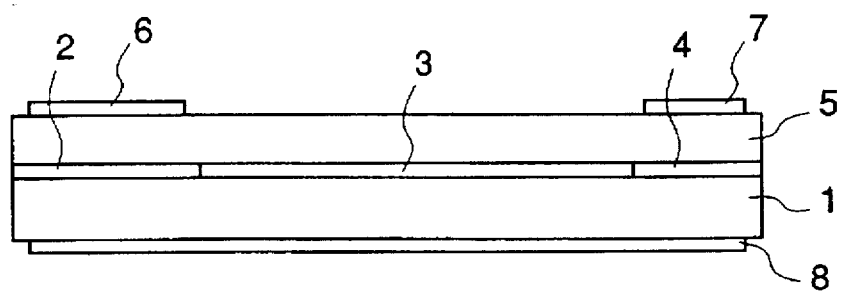
Figure 11:
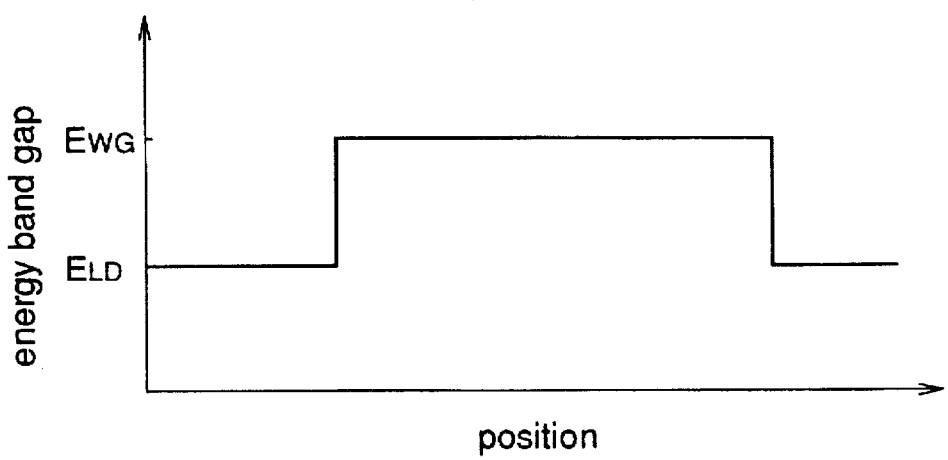

FIG. 10 is a sectional view illustrating an optical integrated circuit device according to a sixth embodiment of the present invention. In FIG. 10, the same reference numerals as in FIGS. 1(a)–1(c) designate the same or corresponding parts, and reference numeral 40 designates a groove. In the optical integrated circuit device described in FIGS. 1(a)–1(c), the diffraction grating 10 is disposed adjacent to the semiconductor laser 2, and the semiconductor laser 2 comprises a distributed feedback (DFB) semiconductor laser. On the contrary, in an optical integrated circuit device of the sixth embodiment, a groove 40 is provided between the semiconductor laser 2 and the waveguide 3 instead of the diffraction grating, and the semiconductor laser 2 comprises a Fabry-Perot (FP) semiconductor laser in which the side surface of the groove and the facet of the semiconductor laser 2 are reflecting mirror surfaces. According to the optical integrated circuit device of this embodiment, using the FP semiconductor laser, the absorption loss in the wave synthesizer 3 is suppressed and a high performance optical integrated circuit device is easily fabricated with a low cost, as in the first embodiment.

While in the above-described embodiments InP series compound semiconductor is employed, GaAs series and other compound semiconductors may be applied in the present invention with the same effects as in the above-described embodiments.

What is claimed is:

1. An optical integrated circuit device comprising:
   a compound semiconductor substrate having front and rear surfaces;
   a single semiconductor laser comprising a compound semiconductor layer having an energy band gap and disposed on the front surface of the compound semiconductor substrate;
   a non-linear waveguide comprising a compound semiconductor layer having the same energy band gap as the compound semiconductor layer of the single semiconductor laser, disposed on the front surface of the compound semiconductor substrate, and optically connected to the single semiconductor laser wherein the waveguide comprises a wave divider for dividing the laser beam emitted from the single semiconductor laser;
   a common electrode disposed on the rear surface of the compound semiconductor substrate;
   a semiconductor laser electrode for establishing a current flow between the laser electrode and the common electrode so that a current is injected into the single semiconductor laser; and
   a waveguide electrode for establishing a current flow between the waveguide electrode and the common electrode so that a current is injected into the waveguide.

2. An optical integrated circuit device comprising:
   a compound semiconductor substrate having front and rear surfaces;
   a plurality of semiconductor lasers, each semiconductor laser comprising a compound semiconductor layer having an energy band gap and disposed on the front surface of the compound semiconductor substrate;
   a non-linear waveguide comprising a compound semiconductor layer having the same energy band gap as the compound semiconductor layer of the semiconductor lasers, disposed on the front surface of the compound semiconductor substrate, and optically connected to the semiconductor lasers, the waveguide comprising a wave synthesizer for synthesizing laser beams emitted from the semiconductor lasers;
   a common electrode disposed on the rear surface of the compound semiconductor substrate;
   a semiconductor laser electrode for establishing a current flow between the laser electrode and the common electrode so that a current is injected into the semiconductor lasers; and
   a waveguide electrode for establishing a current flow between the waveguide electrode and the common electrode so that a current is injected into the waveguide.

3. The optical integrated circuit device of claim 2 further including a diffraction grating disposed adjacent to the semiconductor laser.

4. The optical integrated circuit device of claim 2 wherein the semiconductor laser comprises a multi-quantum well structure.

5. The optical integrated circuit device of claim 2 wherein said waveguide functions as a lens for converging the laser beam produced in the semiconductor laser and emitting the laser beam outside of the device.

6. The optical integrated circuit device of claim 2 further including a groove between the semiconductor laser and the waveguide.

7. The optical integrated circuit device of claim 3 wherein the semiconductor laser comprises a multi-quantum well structure.

8. An optical integrated circuit device comprising:
   a compound semiconductor substrate having front and rear surfaces;
   a plurality of semiconductor lasers, each semiconductor laser comprising a compound semiconductor layer having an energy band gap and disposed on the front surface of the compound semiconductor substrate;
   a non-linear waveguide comprising a compound semiconductor layer having the same energy band gap as the compound semiconductor layer of the semiconductor lasers, disposed on the front surface of the compound semiconductor substrate, and optically connected to the semiconductor lasers, the waveguide comprising a wave synthesizer-divider for synthesizing laser beams emitted from the semiconductor lasers and then dividing the synthesized laser beam;
   a common electrode disposed on the rear surface of the compound semiconductor substrate;
   a semiconductor laser electrode for establishing a current flow between the laser electrode and the common electrode so that a current is injected into the semiconductor lasers; and
   a waveguide electrode for establishing a current flow between the waveguide electrode and the common electrode so that a current is injected into the waveguide.

9. An optical integrated circuit comprising:
   a compound semiconductor substrate having front and rear surfaces;
   a semiconductor laser comprising a compound semiconductor layer having an energy band gap and disposed on the front surface of the compound semiconductor substrate;
   a non-linear waveguide comprising a compound semiconductor layer having the same energy band gap as the compound semiconductor layer of the semiconductor laser, disposed on the front surface of the compound semiconductor substrate, and optically connected to the semiconductor laser;
   a common electrode disposed on the rear surface of the compound semiconductor substrate;
   a semiconductor laser electrode for establishing a current flow between the laser electrode and the common electrode so that a current is injected into the laser;
   a waveguide electrode for establishing a current flow between the waveguide electrode and the common electrode so that a current is injected into the waveguide; and
   a photodiode disposed on the compound semiconductor substrate, the waveguide being arranged so that first and second waveguide parts of the waveguide constitute a Mach-Zehnder interferometer, the first waveguide part being optically connected to the photodiode, and the second waveguide part being optically connected to the semiconductor laser.

10. An optical integrated circuit device comprising:

a compound semiconductor substrate having opposite front and rear surfaces;

a plurality of semiconductor lasers, each laser comprising a compound semiconductor layer having an energy band gap and disposed on the front surface of the compound semiconductor substrate;

a wave synthesizer comprising a compound semiconductor layer having the same energy band gap as the compound semiconductor layer of the semiconductor laser, disposed on the front surface of the compound semiconductor substrate, and respectively optically connected to a plurality of semiconductor lasers to synthesize the laser beams emitted from the semiconductor lasers;

a semiconductor amplifier comprising a compound semiconductor layer having the same energy band gap as the compound semiconductor layer of the semiconductor laser, disposed on the front surface of the substrate, and optically connected to the wave synthesizer;

a common electrode disposed on the rear surface of the compound semiconductor substrate;

a semiconductor laser electrode for establishing a current flow between the laser electrode and the common electrode so that a current is injected into the laser;

a wave synthesizer electrode for establishing a current flow between the wave synthesizer electrode and the common electrode so that a current is injected into the wave synthesizer; and a semiconductor amplifier electrode for establishing a current flow between the amplifier electrode and the common electrode so that a current is injected into the amplifier.

11. The optical integrated circuit device of claim 10 wherein the semiconductor laser comprises a multi-quantum well structure.

12. The optical integrated circuit device of claim 10 further including a diffraction grating disposed adjacent to the semiconductor laser.

13. The optical integrated circuit device of claim 12 wherein the semiconductor laser comprises a multi-quantum well structure.

14. A method for driving an optical integrated circuit device comprising, employing an optical integrated circuit device comprising a compound semiconductor substrate having opposite front and rear surfaces; a plurality of semiconductor lasers, each laser comprising a compound semiconductor layer having an energy band gap and disposed on the front surface of the compound semiconductor substrate; a wave synthesizer comprising a compound semiconductor layer having the same energy band gap as the compound semiconductor layer of the semiconductor laser, disposed on the front surface of the compound semiconductor substrate, and respectively optically connected to a plurality of semiconductor lasers to synthesize the laser beams emitted from the semiconductor lasers; a semiconductor amplifier comprising a compound semiconductor layer having the same energy band gap as the compound semiconductor layer of the semiconductor laser, disposed on the front surface of the substrate, and optically connected to the wave synthesizer; a common electrode disposed on the rear surface of the compound semiconductor substrate; a semiconductor laser electrode for establishing a current flow between the laser electrode and the common electrode so that a current is injected into the laser; a wave synthesizer electrode for establishing a current flow between the waveguide synthesizer electrode and the common electrode so that a current is injected into the wave synthesizer; and a semiconductor amplifier electrode for establishing a current flow between said amplifier electrode and the common electrode so that a current is injected into the amplifier, applying a voltage across the common electrode and the wave synthesizer electrode to inject current into the wave synthesizer.

* * * * *